US006946904B1

(12) United States Patent
Varma et al.

(10) Patent No.: US 6,946,904 B1
(45) Date of Patent: Sep. 20, 2005

(54) USB WITH OVER-VOLTAGE AND SHORT-CIRCUIT PROTECTION

(75) Inventors: Seema Varma, Sunnyvale, CA (US); Nghiem Nguyen, San Jose, CA (US); Ha Chu Vu, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 249 days.

(21) Appl. No.: 10/269,311

(22) Filed: Oct. 11, 2002

(51) Int. Cl.[7] .................. H03K 17/08; G05F 1/571
(52) U.S. Cl. .................. 327/595; 327/321; 327/534; 361/91.1
(58) Field of Search .................. 327/58, 313, 321, 327/530, 534, 595; 455/117, 127, 217, 572, 455/17; 307/130; 323/265, 268, 271; 361/91.1

(56) References Cited

U.S. PATENT DOCUMENTS

| | | | | |
|---|---|---|---|---|
| 5,570,043 A | * | 10/1996 | Churchill | 326/81 |
| 5,654,858 A | * | 8/1997 | Martin et al. | 361/56 |
| 5,717,557 A | * | 2/1998 | Gonzalez et al. | 361/18 |
| 2003/0227320 A1 | * | 12/2003 | Davis | 327/430 |

* cited by examiner

Primary Examiner—Timothy P. Callahan
Assistant Examiner—Terry L. Englund
(74) Attorney, Agent, or Firm—Brett A. Hertzberg; Merchant & Gould PC

(57) ABSTRACT

A transceiver circuit includes driver circuits, receiver circuits, and suspend-mode buffers that are arranged to withstand an over-voltage conditions that would otherwise damage those circuits. An over-voltage sense circuit is arranged to detect the over-voltage condition on a data line in the transceiver. Cascode devices are placed in critical points of the various circuits, while voltages are coupled to other critical points such that none of the transistor devices that are coupled to the data lines are damaged by the over-voltage condition. Selector circuits are arranged to couple the highest detected voltages to various transistor wells to prevent forward biasing parasitic diodes in the transistors. Series switching circuits are arranged to break critical conduction paths during the over-voltage condition. The over-voltage protection scheme is suitable for use in integrated USB transceivers.

20 Claims, 6 Drawing Sheets

USB WITH OVER-VOLTAGE AND SHORT-CIRCUIT PROTECTION

FIELD OF THE INVENTION

The present invention generally related to transceiver circuits that include over-voltage and short-circuit protection. More particularly, the present invention is related to USB transceiver circuits that detect an over-voltage condition that may be caused by a short-circuit condition, and controlling the maximum voltages that are exposed to critical transistors in the USB transceiver.

BACKGROUND OF THE INVENTION

Line drivers are used to transmit data over a communication line to a receiver. The driver operates as a source that provides signals to the communication line, where the signals may be either differential or single-supply referenced. Either a current or voltage output signals may be provided, depending on the overall system requirements.

In one example system, the output signal from the line driver is provided as one or more single-supply referenced voltages. Data is transmitted over the communication line by pulling the voltage between one supply level (e.g., VCC) and another (e.g., ground). The receiver detects the voltage levels on the communication line to receive the data transmission.

In another example system, the output signal from the line driver is provided as a differential voltage that is provided to the communication line. Data is transmitted over the communication line by changing the polarity of the differential voltage from positive to negative. The receiver detects the polarity of the voltage on the communication line to receive the data transmission.

In still another example system, the output signal is a differential current that is driven into a terminating load at the opposite end of the communication line. Data is transmitted over the communication line by changing the polarity of the current from positive to negative. The current that is transmitted over the communication line is converted into a voltage by the terminating load. The receiver detects the changes in the polarity across the terminating load to receive the data transmission.

Many modern computing devices utilize transceiver interface circuitry. Two commonly used interfaces are the universal serial bus interface (USB) and the IEEE 1394 serial interface (also referred to as "Firewire"). Digital cameras, personal computers (PCs), personal data assistants (PDAs) are but a few example devices that often include a universal serial bus interface (USB). Digital video cameras, external hard disk drives, and PCs are but a few example devices that often include an IEEE 1394 interface.

Each transceiver circuit permits communication between two different devices over a serial communication link. The serial communication link is not a fixed bus, but instead is a configured by a user on demand. For example, a digital camera is a portable device that is not connected to a PC via a USB interface until data transfer is required. A USB cable serves as the communication bus that connects the digital camera to the PC such that the data can be transferred. Most LVDS devices can be "hot plugged", meaning that the device need not be powered down before connecting the various devices together.

SUMMARY OF THE INVENTION

A transceiver circuit includes driver circuits, receiver circuits, and suspend-mode buffers that are arranged to withstand an over-voltage conditions that would otherwise damage those circuits. An over-voltage sense circuit is arranged to detect the over-voltage condition on a data line in the transceiver. Cascode devices are placed in critical points of the various circuits, while voltages are coupled to other critical points such that none of the transistor devices that are coupled to the data lines are damaged by the over-voltage condition. Selector circuits are arranged to couple the highest detected voltages to various transistor wells to prevent forward biasing parasitic diodes in the transistors. Series switching circuits are arranged to break critical conduction paths during the over-voltage condition. The over-voltage protection scheme is suitable for use in integrated USB transceivers.

A more complete appreciation of the present invention and its improvements can be obtained by reference to the accompanying drawings, which are briefly summarized below, to the following detailed description of illustrative embodiments of the invention, and to the appended claims.

DETAILED DESCRIPTION OF THE PREFERRED EMBODIMENT

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data signal. The meaning of "a", "an", and "the" include plural references. The meaning of "in" includes "in" and "on".

Interface System Overview

Figure 1:
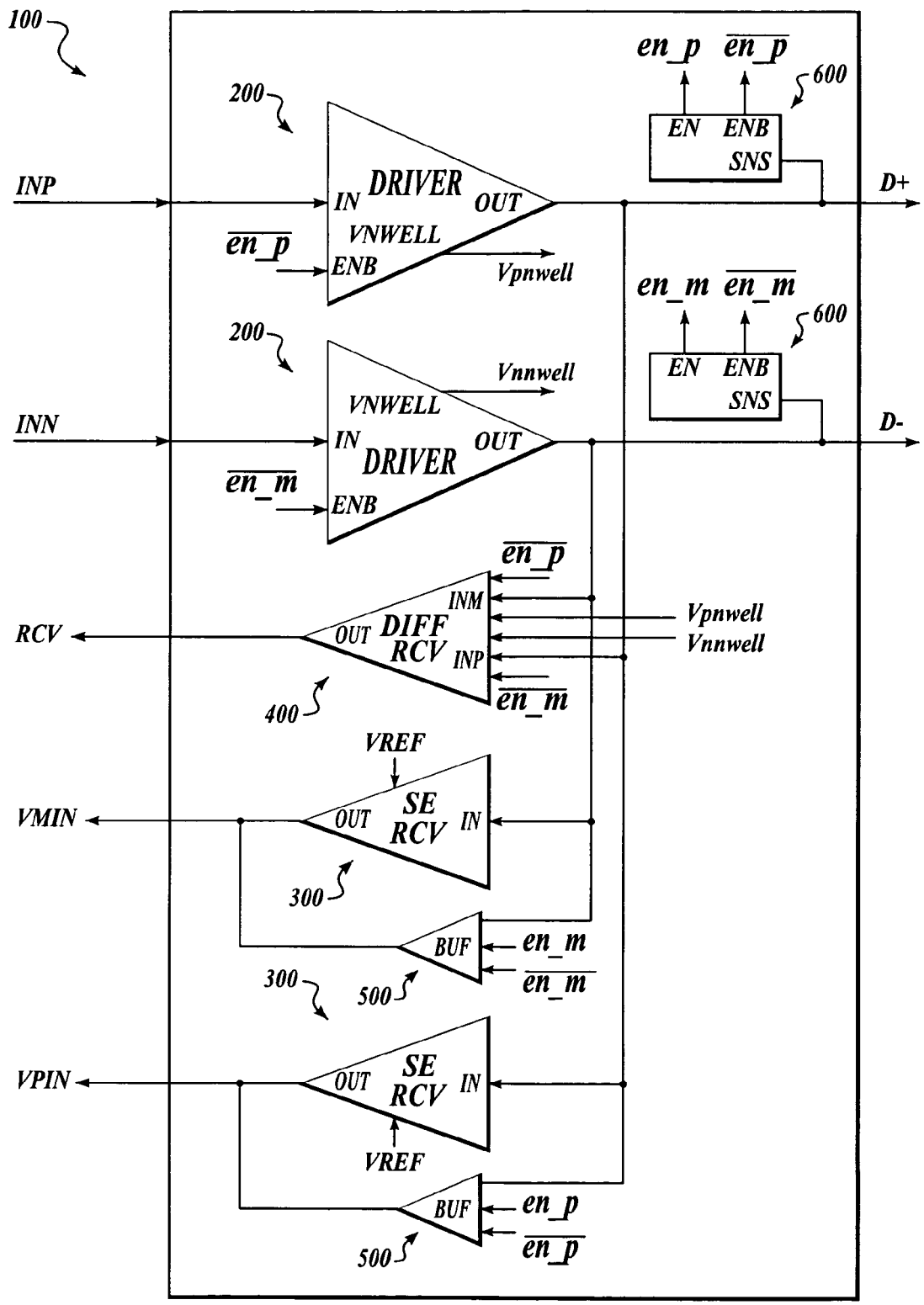
FIG. 1 is a schematic diagram of an exemplary USB interface.

FIG. 1 is a schematic diagram of an exemplary interface system (100) that is arranged in accordance with the present invention. The interface system (100) includes two driver circuits (200), two single-ended receiver circuits (300), a differential receiver circuit (400), two suspend-mode buffers (500), and two over-voltage sense circuits (600).

A pair of data lines (D+, D−) operates as a bi-directional serial communication bus that can be used for transmitting or receiving data. The USB interface system (100) is transmits a signal to the data lines (D+, D−) in response to signals received from a pair of input lines (INP, INN). The USB interface system (100) provides data to a differential receiver line (RCV), a positive input line (VPIN), and a negative input line (VMIN) in response to data that is received from the data lines (D+, D−).

The first driver circuit (200) is coupled between input line INP and data line D+, while the second driver circuit (200) is coupled between input line INN and data line D−. The driver circuits are enabled to transmit signals to the data lines (D+, D−) when enabled by enable lines en_pb and en_mb, respectively. The first and second driver circuits (200) are configured to provide reference signals Vpnwell and Vnnwell, which are used by the differential receiver circuit (400).

The first single-ended receiver circuit (300) is coupled between data line D+ and receiver line VPIN, while the second single-ended receiver circuit (300) is coupled between data line D− and receiver line VMIN. The single-ended receiver circuits utilize another reference signal (VREF).

The differential receiver circuit (400) is configured to provide data to the differential receiver line (RCV) in response to the data lines (D+, D−) when enabled by enable lines en_pb and en_mb. The differential receiver circuit (400) includes over-voltage protection circuitry that is controlled by enable lines en_pb and en_mb, and is responsive to reference signals Vpnwell and Vnnwell. The differential receiver circuit (400) and the driver circuits (200) are not active at the same time.

The first suspend-mode buffer (500) is coupled between data line D+ and receiver line VPIN, while the second suspend-mode buffer (500) is coupled between data line D− and receiver line VMIN. The first suspend-mode buffer (500) includes over-voltage protection circuitry that is controlled by enable lines en_p and en_pb, while the second suspend-mode buffer (500) includes over-voltage protection circuitry that is controlled by enable lines en_m and en_mb.

The first over-voltage sense circuit (600) is coupled to data line D+, while the second over-voltage sense circuit (600) is coupled to data line D−. The first over-voltage sense circuit (600) is configured to provide the en_p and en_pb enable lines, while the second over-voltage sense circuit (600) is configured to provide the en_m and en_mb enable lines.

For each of the operating modes described below, the over-voltage sense circuits (600) must remain active to ensure that all of the electronic circuits are protected from any over-voltage condition on the data lines.

In one operating mode (e.g., normal operation), the interface system (100) receives a differential signal that is applied to INP and INN. The first and second driver circuits (200) receive the differential signal (INP, INN) and provide a differential current drive to the D+ and D− data lines. The single-ended receiver circuits (300) provide signals VPIN and VMIN in response to signals that are sensed from the D+ and D− lines. The differential receiver circuit (400) is configured to provide data to the differential receiver line (RCV) in response to signals that are sensed from the data lines (D+, D−). The suspend mode buffers (500) are deactivated in the normal operating mode (or placed in tri-state) since the single-ended receiver circuits (300) are fully activated. The differential receiver circuit (400) and the driver circuits (200) are not active at the same time.

In another operating mode (e.g., suspended operation), the interface system (100) is arranged to operate in a low-power condition such that all of the circuit blocks except for the suspend mode buffers (500) and the over-voltage sense circuits (600) are deactivated. The suspend-mode buffers (500) are arranged to sense the signals on the data lines (D+, D−) and provide signals to VPIN and VMIN when signals are detected on the data lines. The other circuit blocks are activated into the normal operating mode after signals are detected on the data lines by the suspend mode buffers (500).

In another operating mode (e.g., over-voltage operation), the over-voltage sense circuits (600) detect an over-voltage condition on either one of the D+ and D− data lines. The first driver circuit (200) is disabled when an over-voltage condition is detected on the D+line, while the second driver circuit (200) is disabled when an over-voltage condition is detected on the D−line. Similarly, the differential receiver (400) is disabled when an over-voltage condition is detected on the data lines (D+. D−) . The suspend-mode buffers (500) are also disabled when the over-voltage condition is detected on the data lines (D+, D−) . The receiver circuits are configured to maintain valid DC operating conditions during over-voltage operation such that the receivers do not need to be power cycled or reset before returning to normal operation. The outputs of the receivers are arranged to maintain valid output signals during over-voltage operation.

Each electronic circuit that is illustrated in FIGS. 1–6 is arranged to operate over various transceiver specifications. For example, a USB transceiver must operate with data lines (D+, D−) in the 0–3.6 V nominal operating range, remain undamaged in the 4.4V −5.25V range when shorted to an over-voltage condition, at −1V for worst case AC undershoot, and at 4.6V for worst case AC overshoot.

In addition to the transceiver specifications, each of the electronic circuits must also operate within prescribed operating limits. The operating limits for the electronic circuits are specific to the semiconductor process that is employed to manufacture the electronic circuits. In one example semiconductor process, the maximum drain-source voltage (Vds) is 3.6V, the maximum gate-drain voltage (Vgd) is 4.2V, the maximum gate-source voltage is 4.2V, the maximum gate-bulk voltage is 4.2V, maximum voltage across a gated diode is 5.5V, and the maximum voltage across a non-gated junction (Vj) is 6.5V. Each parameter described-above corresponds to an operating limit that must be maintained to protect the electronic circuits from damage. Other operating limits, other than those described above, are considered within the scope of the present invention.

Exemplary Driver Circuit

Figure 2:
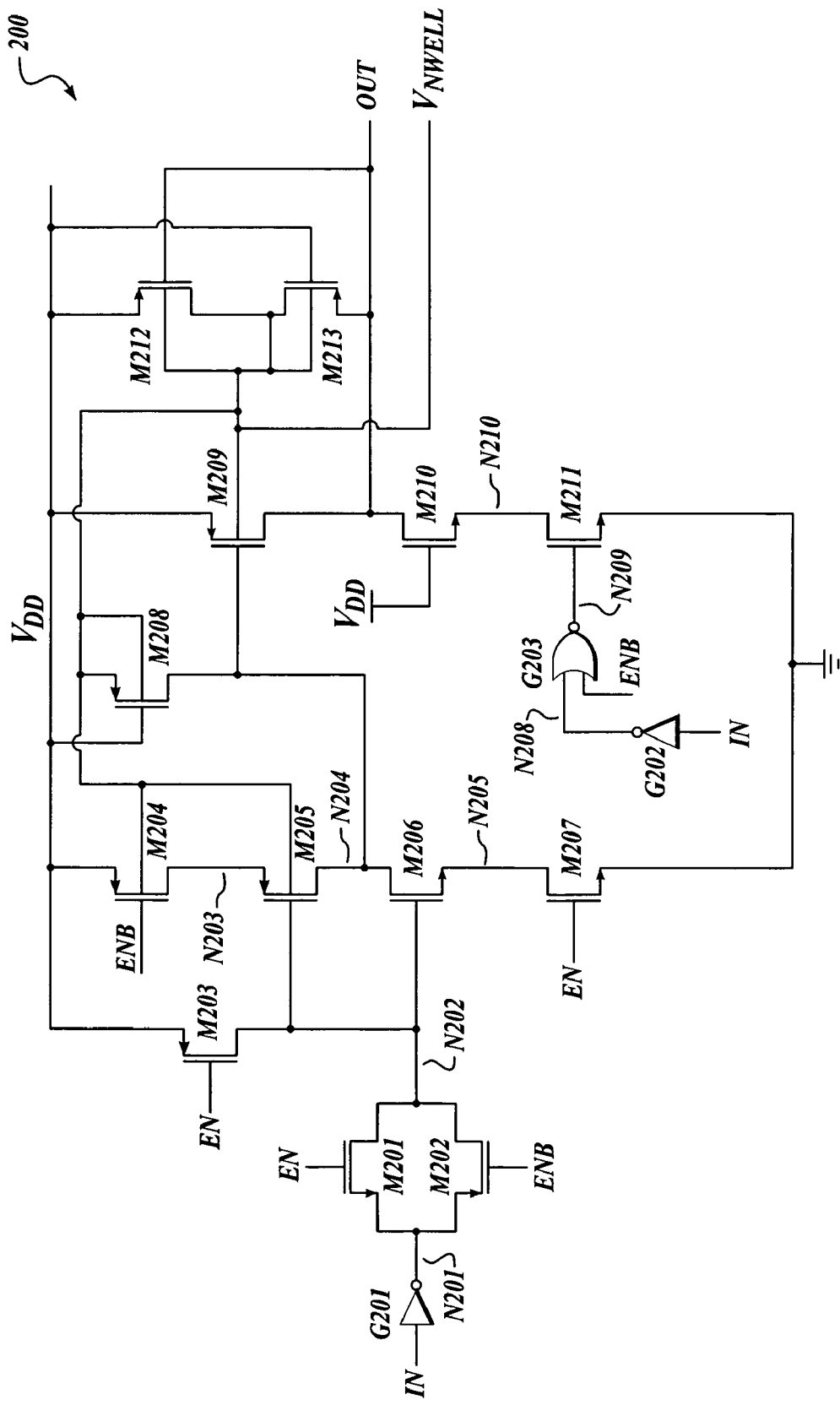
FIG. 2 is a schematic diagram of an exemplary driver circuit in a USB interface.

FIG. 2 is a schematic diagram of an exemplary driver circuit (200) that is arranged in accordance with the present invention. The driver circuit (200) corresponds to a means for driving that is arranged to drive an output signal on a data line in response to an input signal when enabled. Driver circuit 200 includes three logic gates (G201–G203), and thirteen transistors (M201–M213).

Logic gate G201 is coupled between IN and node N201. Logic gate G202 is coupled between IN and node N208. Logic gate G203 includes a first input that is coupled to node N208, a second input that is coupled to ENB, and an output that is coupled to node N209. Transistor M201 includes a drain that is coupled to node N202, a gate that is coupled to EN, and a source that is coupled to node N201. Transistor M202 includes a drain that is coupled to node N202, a gate that is coupled to ENB, and a source that is coupled to node N201. Transistor M203 includes a drain that is coupled to node N202, a gate that is coupled to EN, and a source that is coupled to VDD. Transistor M204 includes a drain that is coupled to node N203, a gate that is coupled to ENB, a source that is coupled to VDD, and a body that is coupled to VNWELL. Transistor M205 includes a drain that is coupled to node N204, a gate that is coupled to node N202, a source that is coupled to node N203, and a body that is coupled to VNWELL. Transistor M206 includes a drain that is coupled to node N204, a gate that is coupled to node N202, and a source that is coupled to node N205. Transistor M207 includes a drain that is coupled to node N205, a gate that is coupled to EN, and a source that is coupled to GND. Transistor M208 includes a drain that is coupled to node N204, a gate that is coupled to VDD, and a source and body that are coupled to VNWELL. Transistor M209 includes a drain that is coupled to OUT, a gate that is coupled to node N204, a body that is coupled to VNWELL, and a source that is coupled to VDD. Transistor M210 includes a drain that is coupled to OUT, a gate that is coupled to VDD, and a source that is coupled to node N210. Transistor M211 includes a drain that is coupled to node N210, a gate that is coupled to node N209, and a source that is coupled to GND. Transistor M212 includes a drain and body that are coupled to VNWELL, a gate that is coupled to OUT, and a source that is coupled to VDD. Transistor M213 includes a drain and body that are coupled to VNWELL, a gate that is coupled to VDD, and a source that is coupled to OUT.

Driver circuit 200 receives an input signal from IN, and provides output signals OUT and VNWELL when enabled. Driver circuit 200 is enabled when signal EN corresponds to logic 1. Signal ENB corresponds to an inverse of signal EN. Transistors M201, M203 and M207 are responsive to the EN signal, while transistors M202, M204, and logic gate G203 are responsive to the ENB signal. The operating modes for the driver circuit (200) are described below.

Driver Circuit: Normal Operating Mode

During the normal operating mode, the driver circuit (200) is enabled by signals EN and ENB. For the exemplary circuit illustrated in FIG. 2, signal EN corresponds to logic 1, and signal ENB corresponds to logic 0 when the normal operating mode is selected. Transistors M203, M208 and M213 are deactivated and have no effect in this operating mode.

Logic gate 201 provides an inverse logic signal at node N201 in response to the input signal (IN). Transistors M201 and M202 are arranged to operate as a transmission gate that transfers the signal from node N201 to node N202. Thus, the signal at node N202 corresponds to an inverse of the input signal (IN). Transistors M204 and M207 are activated such that transistors M205 and M206 operate as an inverting logic circuit that provide a signal at node N204 in response to the signal at node N202. Thus, the signal at node N204 corresponds to the same logic level as the input signal (IN). The signal at node N209 corresponds to the same logic level as the input signal (IN) such that transistors M209–M211 operate as another inverting logic circuit that provides a signal to OUT in response to the input signal (IN) via nodes N204 and N209. Transistors M212 and M213 are arranged to operate as a selector circuit that selects the greater of VDD and OUT and provides the resulting potential to VNWELL. When signal OUT is lower than VDD, transistor M212 is conducting more strongly than M213 such that VDD is coupled to VNWELL. When signal OUT is higher than VDD, transistor M213 is conducting more strongly than transistor M212 such that OUT is coupled to VNWELL. When signal OUT and VDD are equal, both transistors M212 and M213 are conducting equally well such that OUT and VDD are both coupled to VNWELL.

Driver Circuit: Over-Voltage Operating Mode

During the over-voltage operating mode, the driver circuit (200) is disabled by signals EN and ENB, and the output signal (OUT) is above the power supply level (VDD). The output signal (OUT) may exceed the power supply level (VDD) as a result of a short-circuit condition between the respective data line (D+ and/or D−) and an external power supply level. For the exemplary circuit illustrated in FIG. 2, signal EN corresponds to logic 0, and signal ENB corresponds to logic 1 when the over-voltage operating mode is selected. Transistors M201, M202, M204, M207, M211, and M212 are deactivated in this operating mode.

The transmission gate (e.g., transistors M201, M202) is disabled such that node N202 is isolated from node N201. Transistor M203 is arranged to operate as a pull-up circuit that couples VDD to node N202. Transistors M204 and M207 are deactivated such that the inverting logic circuit (M205, M206) is disabled. Transistor M208 is forward biased such that VNWELL is coupled to node N204. Transistor M210 is arranged to provide a potential at node N210 that corresponds to VDD−VTH. Transistor M213 is forward biased such that OUT is coupled to VNWELL.

The over-voltage condition occurs on the OUT signal line such that all devices that are coupled to OUT must be protected from the over-voltage condition. For example, each transistor has a maximum drain-source voltage (VDS), a maximum gate-drain voltage (VGD), and a maximum gate-source voltage (VGS). Typical transistor devices have identical maximum values for VGD and VGS.

Transistors M209–M213 are arranged to operate within the processing limits such that the driver circuit (200) withstands the over-voltage condition without damage. VGD for transistor M209 corresponds to V(OUT)−V(N204). Since VNWELL is coupled to OUT and node N204, VGD corresponds to zero for transistor M209. VDS for transistor M209 corresponds to V(OUT)−VDD. The maximum VDS and the maximum VGD of transistor M211 corresponds to VDD−VTH, where VTH corresponds to the threshold voltage of transistor M210. Transistor M210 has a maximum VDS that corresponds to V(OUT)−(VDD−VTH)), which should be well within process limitations. Also, V(OUT) has a maximum value that is specified by the USB transceiver (e.g. V(OUT)<5.25V for USB 2.0).

In one example, VGDMAX=4.2V, VDSMAX=3.6V, VDD=3.6V, V(OUT)<5.25V, and VTH=1V. For this example, VGD(M209)=0<4.2V,
VDS(M209)=V(OUT)−3.6V<3.6V,
VDG(M210)=V(OUT)−3.6V<4.2V,
VDS(M210)=V(OUT)−2.6V<3.6V,
VDG(M211)=2.6V<4.2V, and VDS(M211)=2.6V.

Exemplary Single-Ended Receiver Circuit

Figure 3:
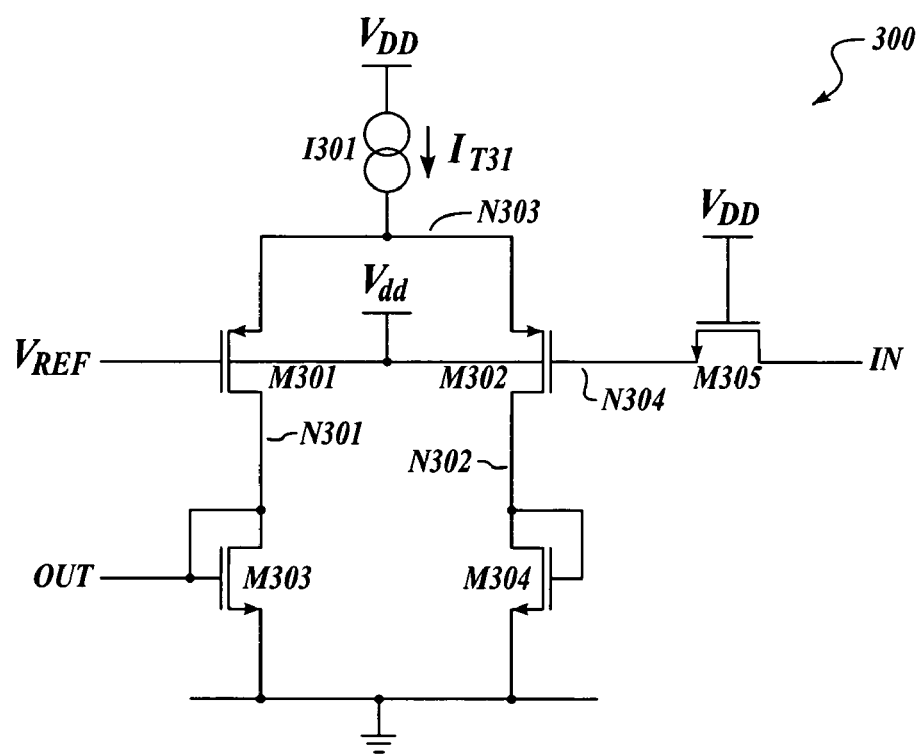
FIG. 3 is a schematic diagram of an exemplary single-ended receiver circuit in a USB interface.

FIG. 3 is a schematic diagram of an exemplary single-ended receiver circuit (300) that is arranged in accordance with the present invention. The single-ended receiver circuit (300) corresponds to a means for receiving that is arranged to provide a receiver signal in response to a sense signal from a data line. Single-ended receiver circuit 300 includes a current source (I301), and five transistors (M301–M305).

Transistor M301 includes a drain that is coupled to node N301, a gate that is coupled to VREF, a source that is coupled to node N303, and a body that is coupled to VDD. Transistor M302 includes a drain that is coupled to node N302, a gate that is coupled to node N304, a source that is coupled to node N303, and a body that is coupled to VDD. Transistor M303 includes a drain and gate that are coupled to OUT, and a source that is coupled to GND. Transistor M304 includes a drain and gate that are coupled to node N302, and a source that is coupled to GND. Transistor M305 includes a drain that is coupled to IN, a gate that is coupled to VDD, and a source that is coupled to node N304. Current source I301 is coupled between VDD and node N303.

Single-Ended Receiver Circuit: Normal Operating Mode

Transistor M305 is biased such that the single-ended receiver (300) is arranged to provide an output signal at the output terminal (OUT) in response to an input signal at the input terminal (IN). Transistor M305 is configured to operate as a switching circuit that couples the input signal to node N304. Transistors M301 and M302 are configured to operate as a differential pair that compares the input signal (via transistor M305) to a reference signal that is provided to VREF. Transistor M303 and M304 are configured to operate as diode-type devices that are selectively forward biased by current IT31 in response to the comparison of the reference signal to the input signal. Thus, the output signal either corresponds to a maximum value of slightly above VTH (the threshold voltage of transistor M303), and a minimum value that is approximately zero.

An amplifier stage (not shown) may be employed to detect the output signal from the output terminal (OUT) and generate high and low logic levels. For example, a mirror transistor that is series coupled to a pull-up circuit may be configured to receive the output signal and provide logic levels. Any appropriate circuit arrangement may be employed to convert the output signal levels from the single-ended receiver circuits to appropriate logic levels.

Single-Ended Receiver Circuit: Over-Voltage Operating Mode

Transistor M305 is configured to protect the gate of transistor M302 from an over-voltage condition in the input signal. Transistor M305 is configured to pass the input signal to the gate of transistor M302 until the input signal level reaches the threshold voltage associated with transistor M305. The voltage associated with node N304 is clamped to VDD−VTH (the threshold voltage of transistor M305) when the input signal exceeds VDD.

Exemplary Differential Receiver Circuit

Figure 4:
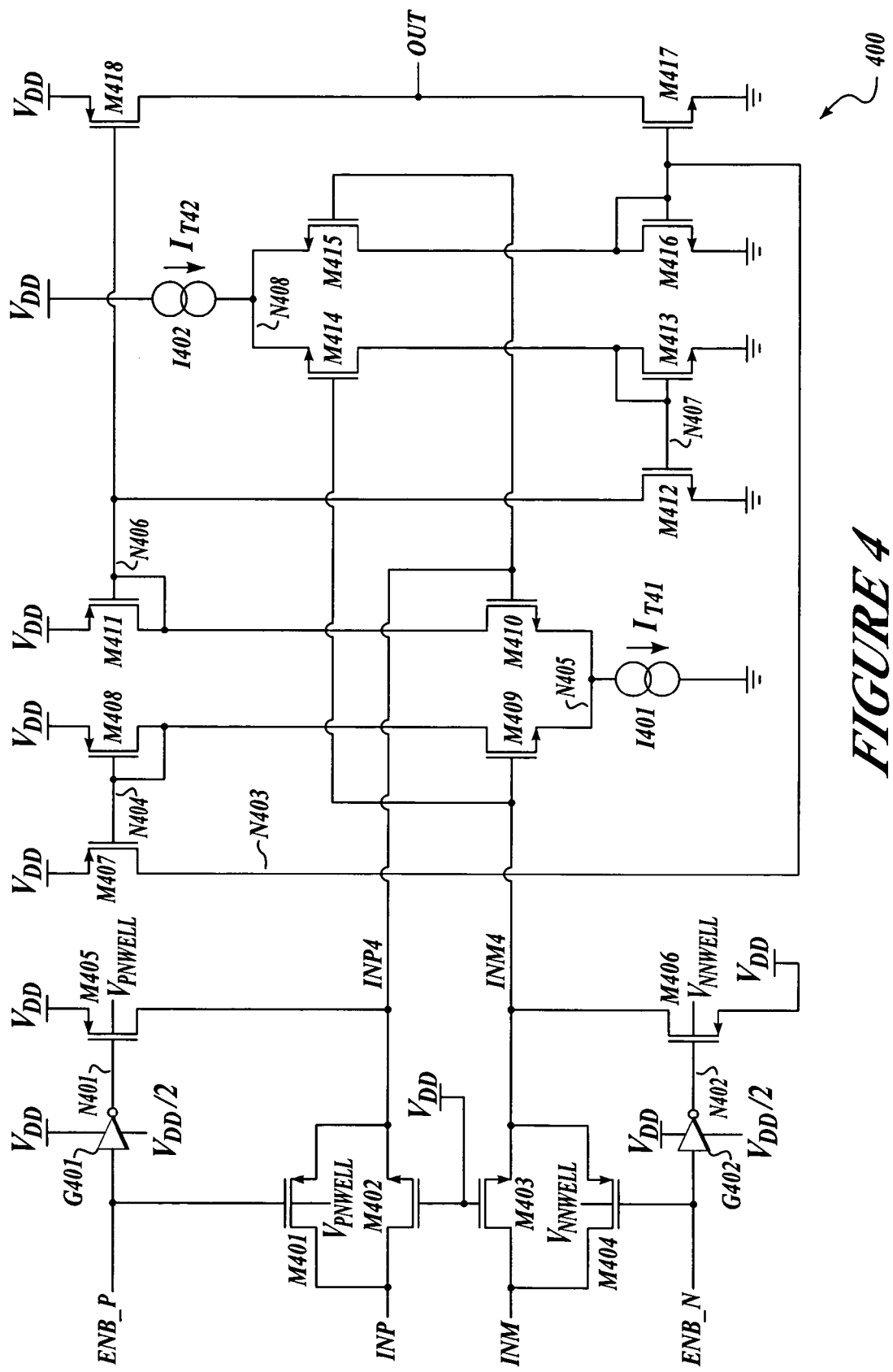
FIG. 4 is a schematic diagram of an exemplary differential receiver circuit in a USB interface.

FIG. 4 is a schematic diagram of an exemplary differential receiver circuit (400) that is arranged in accordance with the present invention. The differential receiver circuit (400) corresponds to a means for differentially receiving that is arranged to provide a receiver signal in response to a differentially senses signal from the data lines. Differential receiver circuit 400 includes two current sources (I401–I402), two logic gates (G401–G402), and eighteen transistors (M401–M418).

Transistor M401 includes a drain that is coupled to INP, a gate that is coupled to ENB_P, a source that is coupled to INP4, and a body that is coupled to VPNWELL. Transistor M402 includes a drain that is coupled to INP, a gate that is coupled to VDD, and a source that is coupled to INP4. Transistor M403 includes a drain that is coupled to INM, a gate that is coupled to VDD, and a source that is coupled to INM4. Transistor M404 includes a drain that is coupled to INM, a gate that is coupled to ENB_N, a source that is coupled to INM4, and a body that is coupled to VNNWELL. Transistor M405 includes a drain that is coupled to INP4, a gate that is coupled to node N401, a source that is coupled to VDD, and a body that is coupled to VPNWELL. Transistor M406 includes a drain that is coupled to INM4, a gate that is coupled to node N402, a source that is coupled to VDD, and a body that is coupled to VNNWELL. Transistor M407 includes a drain that is coupled to node N403, a gate that is coupled to node N404, and a source that is coupled to VDD. Transistor M408 includes a drain and gate that are coupled to node N404, and a source that is coupled to VDD. Transistor M409 includes a drain that is coupled to node N404, a gate that is coupled to INM4, and a source that is coupled to node N405. Transistor M410 includes a drain that is coupled to node N406, a gate that is coupled to INP4, and a source that is coupled to node N405. Transistor M411 includes a drain and gate that are coupled to node N406, and a source that is coupled to node VDD. Transistor M412 includes a drain that is coupled to node N406, a gate that is coupled to node 407, and a source that is coupled to GND. Transistor M413 includes a drain and gate that are coupled to node N407, and a source that is coupled to GND. Transistor M414 includes a drain that is coupled to node N407, a gate that is coupled to INM4, and a source that is coupled to node N408. Transistor M415 includes a drain that is coupled to node N403, a gate that is coupled to INP4, and a source that is coupled to node N408. Transistor M416 includes a drain and gate that are coupled to node N403, and a source that is coupled to GND. Transistor M417 includes a drain that is coupled to OUT, a gate that is coupled to node N403, and a source that is coupled to GND. Transistor M418 includes a drain that is coupled to OUT, a gate that is coupled to node N406, and a source that is coupled to VDD. Logic gate G401 is coupled between ENB_P and node N401, while logic gate G402 is coupled between ENB_N and node N402. Logic gates G401 and G402 have a high power supply signal that is coupled to VDD, and a low power supply signal that is coupled to VDD/2. Current source I401 is coupled between node N405 and GND, while current source I402 is coupled between VDD and node N408.

Differential Receiver Circuit: Normal Operating Mode

During the normal operating mode, the differential receiver circuit (400) is enabled by signals ENB_N and ENB_P. For the exemplary circuit illustrated in FIG. 4, signal ENB_N and ENB_P corresponds to logic 0 when the normal operating mode is selected. Transistors M405 and M406 are deactivated and have no effect in this operating mode.

Logic gate G401 provides an inverse logic signal at node N401 in response to one input signal (ENB_P), while logic gate G402 provides an inverse logic signal at node N402 in response to the other input signal (ENB_N) Transistor pairs M401, M402 and M403, M404 are arranged to operate as switching circuits that pass input signals from INP and INM to INP4 and INM4, respectively.

Transistors M417 and M418 are arranged as an output stage in the differential receiver circuit (400). The output stage is configured to provide an output signal to OUT in response to signals from INP and INM, which are provided to two differential pair circuits that cooperate with the output stage to operate over a rail-to-rail common mode input range.

The first differential pair circuit includes transistors M409, M410, and current source I401. The first differential pair circuit steers current IT41 from current source I401 in response to the difference between signals from INP4 and INM4. Transistors M408 and M407 are arranged as a first current mirror circuit that is responsive to current from transistor M409, and provides biasing to transistor M417.

Transistors M411 and M418 are arranged as a second current mirror circuit that is responsive to current from transistor M410.

The second differential pair circuit includes transistors M414, M415, and current source 1402. The second differential pair circuit steers current IT42 from current source 1402 in response to the difference between signals from INP4 and INM4. Transistors M412 and M413 are arranged as a third current mirror circuit that is responsive to current from transistor M414, and provides biasing to transistor M411. Transistors M416 and M417 are arranged as a fourth current mirror circuit that is responsive to current from transistor M415.

Differential Receiver Circuit: Over-Voltage Operating Mode

During the over-voltage operating mode, the differential receiver circuit (400) is protected from high input voltages (e.g., at the INP and INM terminals) when either one of signals ENB_N or ENB_P are active. For the exemplary circuit illustrated in FIG. 4, signal ENB_N and/or ENB_P corresponds to logic 1 when the over-voltage operating mode is selected. Transistors M405 and M406 are configured to operate as pull-up circuits that couple at least one of INP4 and INM4 to VDD in the over-voltage operating mode.

In one example over-voltage operating mode, the ENB_P signal corresponds to logic 1 when the input signal at INP exceeds the high power supply voltage (VDD). The logic 1 signal disabled transistor M401. Logic gate G401 provides a logic 0 signal at node N401, which activates transistor M405 such that VDD is coupled to INP4.

In another example over-voltage operating mode, the ENB_N signal corresponds to logic 1 when the input signal at INM exceeds the high power supply voltage (VDD). The logic 1 signal disabled transistor M404. Logic gate G402 provides a logic 0 signal at node N402, which activates transistor M406 such that VDD is coupled to INM4.

Transistors M401–M418 are arranged to operate within the processing limits such that the differential receiver circuit (400) withstands the over-voltage condition on the input signals (INP, INM, which corresponds to D+ and D– as shown in FIG. 1) without damage. The pull-up circuits (e.g., transistors M405 and M406) ensure that the gate of transistors M409, M410, M414, and M415 never exceed the high power supply voltage (VDD).

The body connections for transistors M401 and M404 are coupled to VPNWELL and VNNWELL, respectively. VPNWELL is coupled to the higher of VDD and the respective input signal (INP, D+) from one of the driver circuits (200), while VNNWELL is coupled to the higher of VDD and the respective input signal (INM, D–) from another one of the driver circuits (200), as previously described with respect to FIG. 2. Since the body terminal for each of transistors M401 and M404 is always connected to the highest potential (either VDD or the input signal), the parasitic drain-well diodes in transistors M401 and M404 will remain reverse biased.

The voltage associated with the logic 1 signal for ENB_P corresponds to the higher of VDD and INP (D+) as will be described later with respect to the over-voltage sense circuit (600). Similarly, the voltage associated with the logic 1 signal for ENB_N corresponds to the higher of VDD and INM (D–). Transistors M401 and M404 have no voltages across their drain-gate terminals during their respective over-voltage conditions.

Since logic gate G401 has a low power supply that corresponds to VDD/2 such that the logic 0 signal at node N401 also corresponds to VDD/2. Similarly, logic gate G402 has a low power supply that corresponds to VDD/2 such that the logic 0 signal at node N402 also corresponds to VDD/2. Transistor M405 has a maximum gate-body voltage that corresponds to the difference between VDD/2 and VPNWELL. Similarly, transistor M406 has a maximum gate-body voltage that corresponds to the difference between VDD/2 and VNNWELL.

The differential receiver circuit (400) is arranged to resist glitching in the output signal (OUT) when an AC overshoot causes the ENB signal (or signals) to momentarily change to logic 1. The pull-up circuits (e.g., transistors M405, M406) bypass transistor M401 and transistor M404 such that the input signals have no effect on the output signal in the over-voltage operating mode.

Exemplary Suspend-Mode Buffer Circuit

Figure 5:
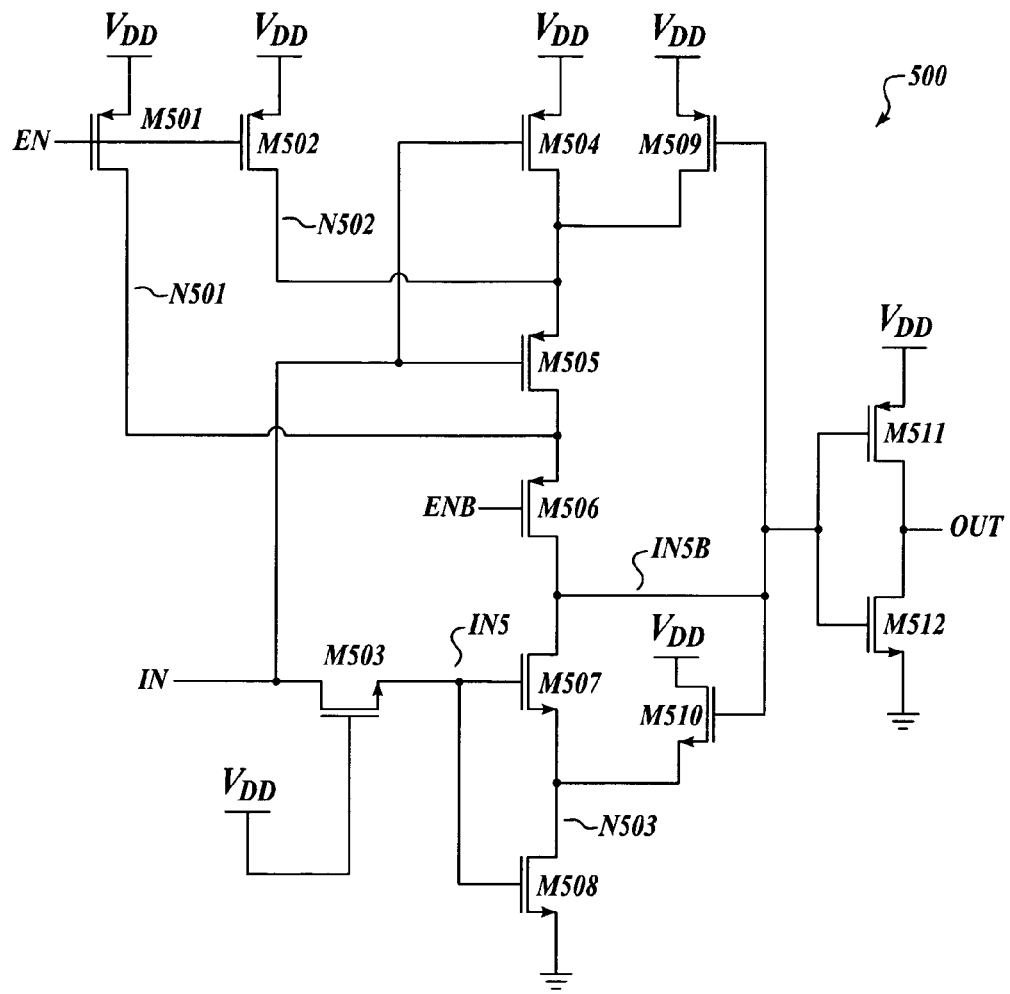
FIG. 5 is a schematic diagram of an exemplary suspend-mode buffer circuit in a USB interface.

FIG. 5 is a schematic diagram of an exemplary suspend-mode buffer circuit (500) that is arranged in accordance with the present invention. The suspend mode buffer circuit (500) corresponds to a means for buffering that is arranged to provide a buffered sense signal in response to a sense signal from a data line when active. Suspend-mode buffer circuit 500 includes twelve transistors (M501–M512).

Transistor M501 includes a drain that is coupled to node N501, a gate that is coupled to EN, and a source that is coupled to VDD. Transistor M502 includes a drain that is coupled to node N502, a gate that is coupled to EN, and a source that is coupled to VDD. Transistor M503 includes a drain that is coupled to IN, a gate that is coupled to VDD, and a source that is coupled to IN5. Transistor M504 includes a drain that is coupled to node N502, a gate that is coupled to IN, and a source that is coupled to VDD. Transistor M505 includes a drain that is coupled to node N501, a gate that is coupled to IN, and a source that is coupled to node N502. Transistor M506 includes a drain that is coupled to IN5B, a gate that is coupled to ENB, and a source that is coupled to node N501. Transistor M507 includes a drain that is coupled to IN5B, a gate that is coupled to IN5, and a source that is coupled to node N503. Transistor M508 includes a drain that is coupled to node N503, a gate that is coupled to IN5, and a source that is coupled to GND. Transistor M509 includes a drain that is coupled to node N502, a gate that is coupled to IN5B, and a source that is coupled to VDD. Transistor M510 includes a drain that is coupled to VDD, a gate that is coupled to IN5B, and a source that is coupled to node N503. Transistor M511 includes a drain that is coupled to OUT, a gate that is coupled to IN5B, and a source that is coupled to VDD. Transistor M512 includes a drain that is coupled to OUT, a gate that is coupled to IN5B, and a source that is coupled to GND.

The suspend mode buffers are normally disabled unless the system is in the suspend mode. For example, the suspend mode buffers are disabled in the normal operating mode, and again during the suspend mode operation.

Suspend Mode Buffer: Suspend Mode Operation

During the suspend mode, the suspend mode buffer (500) is enabled by signals ENB_N and ENB_P. For the exemplary circuit illustrated in FIG. 5, signal EN corresponds to logic 1 and when the suspend operating mode is selected. Signal ENB corresponds to an inverse of signal EN. Transistors M501, M502 are deactivated in the suspend mode and have no effect on the remaining circuitry in this operating mode.

Transistor M503 is configured to operate as a transmission gate that couples an input signal from IN to IN5. Transistors M504 and M505 are configured to operate as a cascoded source circuit that is responsive to the input signal from IN, while transistors M507 and M508 are arranged to operate as a cascoded sink circuit that is responsive to the input signal from IN5. Transistor M506 is configured to operate as a switching circuit that couples node N501 to IN5B such that the source and sink circuits are coupled together to operate as a cascoded inverter circuit during the suspend mode. Transistors M511 and M512 are arranged to operate as an inverter circuit that provides a signal to OUT in response to the signal from IN5.

Transistors M509 and M510 are arranged to provide hysterisis to the cascoded inverter circuit. Transistor M510 is activated and transistor M509 is deactivated when the input signal corresponds to logic 0, such that the cascoded inverter circuit has a first threshold. Transistor M510 is deactivated and transistor M509 is activated when the input signal corresponds to logic 1, such that the cascoded inverter circuit has a second threshold. The first threshold and second threshold are different from one another such that the suspend mode buffers have a hysterisis characteristic that is less susceptible to noise on the data lines.

Suspend Mode Buffer: Over-Voltage Operating Mode

During the over-voltage operating mode, the suspend mode buffer (500) is disabled by EN and ENB. For the exemplary circuit illustrated in FIG. 5, signal EN corresponds to logic 0 and ENB corresponds to logic 1 when the over-voltage operating mode is selected. Transistors M501 and M502 are activated, while transistor M506 is disabled.

Transistor M503 is arranged to protect transistors M507 and M508 from the over-voltage condition on the input signal. The voltage at IN5 is limited to VDD−VTH, where VTH corresponds to the threshold voltage of transistor M503. Thus, the maximum gate-source and gate-drain voltage for transistors M507 and M508 corresponds to VDD−VTH, which are within process limits.

Transistors M501 and M502 are arranged to operate as a protection circuit that protects transistors M504 and M505 from the over-voltage condition on the input signal. The voltage at nodes N501 and N502 are coupled to VDD. Thus, the maximum gate-source and gate-drain voltages for transistor M504 and M505 corresponds to V(IN)−VDD. The drain-source voltages for transistors M504 and M505 correspond to zero.

Transistor M506 is disabled such that node N501 is isolated from IN5B, such that the cascoded pull-up network (transistors M504, M505) are isolated from the cascoded pull-down network (transistors M507, M508). The output of the suspend mode buffer (OUT) is maintained as a high logic signal during the over-voltage condition, maintaining the functionality of the buffer.

Exemplary Over-Voltage Sense Circuit

Figure 6:
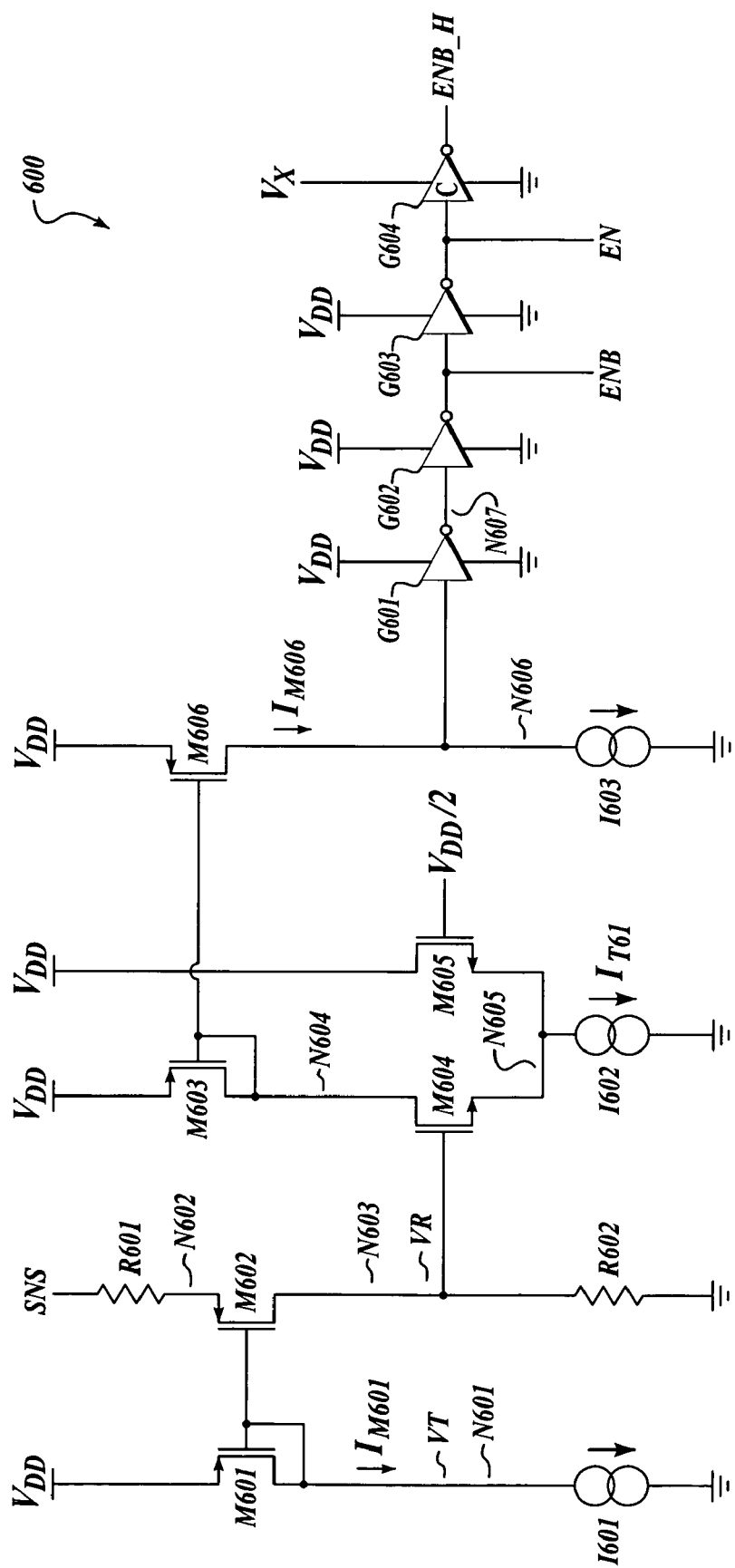
FIG. 6 is a schematic diagram of an exemplary over-voltage sense circuit, arranged in accordance with the present invention.

FIG. 6 is a schematic diagram of an exemplary over-voltage sense circuit (600) that is arranged in accordance with the present invention. The over-voltage sense circuit (600) corresponds to a means for detecting that is arranged to detect an over-voltage condition on a data line. Over-voltage sense circuit 600 includes six transistors (M601–M606), two resistors (R601, R602), three current sources (I601–I603), and four logic gates (G601–G604).

Transistor M601 includes a drain and gate that are coupled to node N601, and a source that is coupled to VDD. Transistor M602 includes a drain that is coupled to node N603, a gate that is coupled to node N601, and a source that is coupled to node N602. Transistor M603 includes a drain and gate that are coupled to node N604, and a source that is coupled to node VDD. Transistor M604 includes a drain that is coupled to node N604, a gate that is coupled to node N603, and a source that is coupled to node N605. Transistor M605 includes a drain that is coupled to VDD, a gate that is coupled to VDD/2, and a source that is coupled to node N605. Transistor M606 includes a drain that is coupled to node N606, a gate that is coupled to node N604, and a source that is coupled to VDD. Resistor R601 is coupled between SNS and node N602. Resistor R602 is coupled between node N603 and GND. Current source I601 is coupled between node N601 and GND. Current source I602 is coupled between node N605 and GND. Current source I603 is coupled between node N606 and GND. Logic gate G601 is coupled between node N606 and node N607. Logic gate 0602 is coupled between node N607 and ENB. Logic gate 0603 is coupled between ENB and EN. Logic gate G604 is coupled between EN and ENB_H.

The over-voltage sense circuit is active in all operating modes. Voltage VX corresponds to the higher of VDD and a respective one of the data lines (D+ or D− from FIG. 1). The voltage for VX corresponds to the VNWELL signal from the driver circuits (either VPNWELL or VNNWELL). Logic gate G604 includes a cascode circuit arrangement such that the logic gate can withstand higher voltages. For example, logic gate G604 may comprise an inverter circuit that has stacked P-type devices and stacked N-type devices such that the inverter is a cascoded inverter circuit. The output voltage from logic gate G604 corresponds to either a ground level or a level corresponding to VX.

Current source I601 and transistor M601 are arranged to provide a first reference signal (VT) to node N601. Transistor M602 is arranged to cooperate with resistor R601 and R602 such that they provide a second reference signal (VR) at node N603. One of the data lines (D+ or D−) is coupled to the sense node (SNS) such that transistor M602 detects when SNS exceeds a trip point. The trip point is determined by resistor R602, transistor M602, and the first reference signal (VT). Resistor R601 is arranged to limit the current to transistor M602.

Transistors M604 and M605 are arranged to operate as a differential pair that shares a common connection to current source I602. Transistor M603 activates transistor M606 when the second reference signal (VR) exceeds VDD/2, indicating that the sense node (SNS) has detected the over-voltage condition. Node N606 changes from logic 0 to logic 1 when transistor M606 is activated such that the logic circuits (G601–G604) detect the over-voltage condition. Signals ENB and ENB_H correspond to logic 1, and signal EN corresponds to logic 0 when the over-voltage condition is detected.

The above-described examples include discrete components and circuits that are combined together to provide an over-all functionality. One or more of the circuit blocks may be combined together, or separated apart without departing from the spirit of the present invention. Moreover, the over-all circuit topologies may be applied to field effect devices, bipolar junction devices as well as other technologies.

The above specification, examples and data provide a complete description of the manufacture and use of the composition of the invention. Since many embodiments of the invention can be made without departing from the spirit and scope of the invention, the invention resides in the claims hereinafter appended.

We claim:
1. An apparatus, comprising:
an over-voltage sense circuit that is arranged to monitor a sense signal on a data line and activate a disable signal when an over-voltage condition is detected on the data line;
a selector circuit that is arranged to provide a selected voltage, wherein the selected voltage corresponds to the greater of a power supply voltage and the sense signal; and
a driver circuit that is arranged to provide an output signal to the data line in response to an input signal when enabled, wherein the driver circuit is disabled when the disable signal is active, the driver circuit comprising:
    a transmission gate that is configured to transfer the input signal to a first node when the driver circuit is enabled;
    a first inverting logic circuit that is arranged to provide a second signal at a second node in response to a first signal from the first node when active, wherein the first inverting logic circuit is deactivated when the disable signal is active;
    a second inverting logic circuit that is arranged to provide the output signal to the data line in response to the second signal and the input signal when active, wherein the second inverting logic circuit is deactivated when the disable signal is active;
    a transistor that is configured to couple the sense signal to the second node when the sense signal exceeds the power supply voltage by a threshold voltage that is associated with the transistor; and
    a pull-up circuit that is configured to couple the power supply voltage to the first node when the disable signal is active.

2. The apparatus of claim 1, wherein the first inverting logic circuit comprises:
a first transistor that is activated when the driver circuit is enabled, wherein the first transistor includes a source terminal that is coupled to the power supply voltage and a body terminal that is coupled to the selected voltage;
a second transistor that is coupled between the first transistor and the second node such that the power supply voltage is coupled to the second node when the first signal corresponds to a first logic level, wherein the second transistor includes a body terminal that is coupled to the selected voltage;
a third transistor that is activated when the driver circuit is enabled, wherein the third transistor includes a source terminal that is coupled to a circuit ground voltage; and
a fourth transistor that is coupled between the third transistor and the second node such that the circuit ground voltage is coupled to the second node when the first signal corresponds to a second logic level that is an inverse of the first logic level.

3. The apparatus of claim 1, wherein the second inverting logic circuit comprises:
a first transistor that includes a source terminal that is coupled to the power supply voltage, a gate terminal that is coupled to the second node, a drain that is coupled to the data line, and a body terminal that is coupled to the selected voltage;
a second transistor that includes a source terminal that is coupled to a circuit ground voltage, wherein a gate terminal of the second transistor corresponds to the circuit ground voltage when the driver circuit is disabled, and wherein the gate terminal of the second transistor corresponds to the input signal when the driver circuit is enabled; and
a third transistor that is coupled between the data line and a drain of the second transistor, wherein the gate of the third transistor is coupled to the power supply voltage.

4. The apparatus of claim 1, wherein the selector circuit comprises:
a first transistor that includes a source terminal that is coupled to the power supply voltage, a gate terminal that is coupled to the data line, and a drain and body terminal that are coupled to an intermediary node; and
a second transistor that includes a source terminal that is coupled to the data line, a gate terminal that is coupled to the power supply voltage, and a drain and body terminal that are coupled to the intermediary node, such that the voltage associated with the intermediary node corresponds to the selected voltage.

5. The apparatus of claim 1, further comprising:
another over-voltage sense circuit that is arranged to monitor another sense signal on another data line and activate another disable signal when an over-voltage condition is detected on the other data line;
another selector circuit that is arranged to provide another selected voltage, wherein the other selected voltage corresponds to the greater of the power supply voltage and the other sense signal; and
another driver circuit that is arranged to provide another output signal to the other data line in response to another input signal when enabled, wherein the other driver circuit is disabled when the other disable signal is active, the other driver circuit comprising:
    another transmission gate that is configured to transfer the other input signal to another first node when the other driver circuit is enabled;
    another first inverting logic circuit that is arranged to provide another second signal at another second node in response to another first signal from the other first node when active, wherein the other first inverting logic circuit is deactivated when the other disable signal is active;
    another second inverting logic circuit that is arranged to provide the other output signal to the other data line in response to the other second signal and the other input signal when active, wherein the other second inverting logic circuit is deactivated when the other disable signal is active;
    another transistor that is configured to couple the other sense signal to the other second node when the other sense signal exceeds the power supply voltage by another threshold voltage that is associated with the other transistor; and
    another pull-up circuit that is configured to couple the power supply voltage to the other first node when the other disable signal is active.

6. The apparatus of claim 1, further comprising: a single-ended receiver circuit that is arranged to provide a receiver signal in response to a reference signal and the sense signal, wherein the single-ended receiver circuit includes a differential pair circuit that provides the receiver signal in response to a comparison between the reference signal and an intermediate signal, and a switching circuit that provides the intermediate signal in response to the sense signal, wherein the switching circuit is arranged to limit the level associated with the intermediate signal.

7. The apparatus of claim 6, further comprising: another single-ended receiver circuit that is arranged to provide another receiver signal in response to the reference signal and another sense signal that is associated with another data line, wherein the other single-ended receiver circuit includes another differential pair circuit that provides the other receiver signal in response to a comparison between the reference signal and another intermediate signal, and another switching circuit that provides the other intermediate signal in response to the other sense signal, wherein the other switching circuit is arranged to limit the level associated with the other intermediate signal.

8. The apparatus of claim 6, wherein the switching circuit comprises another transistor, wherein a gate of the other transistor receives the power-supply voltage, a drain of the other transistor receives the sense signal, and a source of the other transistor provides the intermediary signal such that the intermediary signal has a maximum value that corresponds to the difference between the power supply voltage and the threshold voltage that is associated with the other transistor.

9. The apparatus of claim 1, further comprising:
  another over-voltage sense circuit that is arranged to monitor another sense signal on another data line and activate another disable signal when an over-voltage condition is detected on the other data line; and
  a differential receiver circuit that is arranged to provide a receiver signal in response to the sense signal and the other sense signal when enabled, wherein a first portion of the differential receiver circuit is disabled when the disable signal is active, and wherein a second portion of the differential receiver circuit is disabled when the other disable signal is active, the differential receiver circuit comprising:
    a first pull-up transistor that is arranged to couple the power supply voltage to a first input node when the disable signal is active;
    a second pull-up transistor that is arranged to couple the power supply voltage to a second input node when the other disable signal is active;
    a first switching circuit that is coupled between the data line and the first input node, wherein the first switching circuit is responsive to the disable signal;
    a second switching circuit that is coupled between the other data line and the second input node, wherein the second switching circuit is responsive to the other disable signal;
    a first differential pair circuit that is coupled to the first and second input nodes, wherein the first differential pair circuit is configured to operate over a first common-mode input range;
    a second differential pair circuit that is coupled to the first and second input nodes, wherein the second differential pair circuit is configured to operate over a second common-mode input range; and
    an output stage that is arranged to cooperate with the first and second differential pair circuits such that the output stage provides the receiver signal in response to signals from the first and second input nodes.

10. The apparatus of claim 9, further comprising an inverter circuit that is coupled between the disable signal and the gate of the first pull-up transistor, wherein the inverter operates from a low power-supply voltage that corresponds to half of the power-supply voltage such that the gate voltage of the first pull-up transistor operates over the range of the power supply voltage and half of the power supply voltage.

11. The apparatus of claim 9, wherein the body terminal of the first pull-up transistor is coupled to the selected voltage.

12. The apparatus of claim 9, wherein the first switching circuit is configured to couple the sense signal to the first input node when the disable signal is inactive, and limit the voltage associated with the first node to a predetermined level when the disable signal is active.

13. The apparatus of claim 12, wherein the predetermined level corresponds to the difference between the power supply voltage and a threshold voltage that is associated with a switching transistor in the first switching circuit.

14. The apparatus of claim 9, wherein the over-voltage sense circuit is further configured to provide the disable signal as the greater of the power-supply voltage and the sense signal when the disable signal is active.

15. The apparatus of claim 9, wherein the other over-voltage sense circuit is further configured to provide the other disable signal as the greater of the power-supply voltage and the other sense signal when the other disable signal is active.

16. The apparatus of claim 1, further comprising a suspend mode buffer circuit that is arranged to provide a suspended output signal in response to the sense signal when enabled, wherein the suspend mode buffer is disabled by the disable signal, the suspend mode buffer comprising:
  another transmission gate that is configured to transfer the sense signal to a first input node as a first input signal, wherein the other transmission gate is arranged to limit the first input signal to a predetermined level;
  a cascoded source circuit that is responsive to the sense signal;
  a cascoded sink circuit that is responsive to the first input signal;
  a switching circuit that is configured to couple the cascoded source circuit to the cascoded sink circuit to form a cascoded inverter circuit that provides an inverse input signal in response to the sense signal and the first input signal when the suspend mode buffer is enabled;
  an output inverter that is configured to provide the suspended output signal in response to the inverse input signal; and
  a protection circuit that is arranged to couple the power-supply voltage to the cascoded source circuit when enabled, wherein the protection circuit is enabled when the disable signal is active.

17. An apparatus, comprising:
  an over-voltage sense circuit that is arranged to monitor a sense signal on a data line and activate a disable signal when an over-voltage condition is detected on the data line;
  another over-voltage sense circuit that is arranged to monitor another sense signal on another data line and activate another disable signal when an over-voltage condition is detected on the other data line;
  a selector circuit that is arranged to provide a selected voltage, wherein the selected voltage corresponds to the greater of a power supply voltage and the sense signal;
  another selector circuit that is arranged to provide another selected voltage, wherein the other selected voltage corresponds to the greater of the power supply voltage and the other sense signal; and
  a differential receiver circuit that is arranged to provide a receiver signal in response to the sense signal and the other sense signal when enabled, wherein a first portion of the differential receiver circuit is disabled when the disable signal is active, and wherein a second portion of the differential receiver circuit is disabled when the other disable signal is active, the differential receiver circuit comprising:
- a first pull-up transistor that is arranged to couple the power supply voltage to a first input node when the disable signal is active;
- a second pull-up transistor that is arranged to couple the power supply voltage to a second input node when the other disable signal is active;
- a first switching circuit that is coupled between the data line and the first input node, wherein the first switching circuit is responsive to the disable signal;
- a second switching circuit that is coupled between the other data line and the second input node, wherein the second switching circuit is responsive to the other disable signal;
- a first differential pair circuit that is coupled to the first and second input nodes, wherein the first differential pair circuit is configured to operate over a first common-mode input range;
- a second differential pair circuit that is coupled to the first and second input nodes, wherein the second differential pair circuit is configured to operate over a second common-mode input range; and
- an output stage that is arranged to cooperate with the first and second differential pair circuits such that the output stage provides the receiver signal in response to signals from the first and second input nodes.

18. An apparatus for driving a load, comprising:
- a first means for detecting that is arranged to detect an over-voltage condition on a first data line;
- a second means for detecting that is arranged to detect another over-voltage condition on a second data line;
- a first means for driving that is arranged to drive a first output signal to a first portion of the load on the first data line in response to a first input signal when enabled, wherein the first means for driving is disabled when the over-voltage condition is detected on the first data line;
- a second means for driving that is arranged to drive a second output signal to a second portion of the load on the second data line in response to a second input signal when enabled, wherein the second means for driving is disabled when the other over-voltage condition is detected on the second data line, wherein the first and second input signals are related to one another, and the first means for driving and the second means for driving are arranged to provide a differential signal to the load in response to the first and second input signals;
- each of the first and second means for driving comprising:
  - a means for transmitting a respective one of the first and second input signal to a first node when the respective means for driving is enabled;
  - a first logic means for providing a second signal at a second node in response to a first signal from the first node when active, wherein the first logic means is deactivated when the disable signal for the respective means for driving is active;
  - a second logic means for providing the output signal to the respective data line in response to the second signal and the respective input signal when active, wherein the second logic means is deactivated when the disable signal for the respective means for driving is active;
  - a first coupling means for coupling a sense signal on the respective data line to the second node when the sense signal exceeds a predetermined threshold level; and
  - a second coupling means for coupling the first node to a predetermined voltage level when the disable signal for the respective means for driving is active.

19. An apparatus comprising:
- a first means for detecting that is arranged to detect an over-voltage condition on a first data line;
- a second means for detecting that is arranged to detect another over-voltage condition on a second data line;
- a first means for driving that is arranged to drive a first output signal on the first data line in response to a first input signal when enabled, wherein the first means for driving is disabled when the over-voltage condition is detected on the first data line;
- a second means for driving that is arranged to drive a second output signal on the second data line when enabled, wherein the second means for driving is disabled when the other over-voltage condition is detected on the second data line;
- a first means for receiving that is arranged to provide a first receiver signal in response to a first sense signal from the first data line;
- a second means for receiving that is arranged to provide a second receiver signal in response to a second sense signal from the second data line;
- a means for differentially receiving that is arranged to provide a third receiver signal in response to a differentially sensed signal from the first and second data lines;
- a first means for buffering that is arranged to provide a first buffered sense signal in response to the first sense signal from the first data line when active; and
- a second means for buffering that is arranged to provide a second buffered sense signal in response to the second sense signal from the second data line when active.

20. The apparatus of claim 19, wherein the first means for driving and the second means for driving are arranged in cooperation with one another such that the first data line and the second data line form a differential data line.

* * * * *

UNITED STATES PATENT AND TRADEMARK OFFICE
CERTIFICATE OF CORRECTION

PATENT NO. : 6,946,904 B1
DATED : September 20, 2005
INVENTOR(S) : Seema Varma et al.

It is certified that error appears in the above-identified patent and that said Letters Patent is hereby corrected as shown below:

<u>Title page,</u>
Item [57], ABSTRACT,
Line 1, "suspend-mode buffers that are arranged to withstand an over-voltage conditions" should read -- suspend-mode buffers that are arranged to withstand an over-voltage condition --.

<u>Column 7,</u>
Line 6, "source 1301 is coupled" should read -- source I301 is coupled --.

<u>Column 8,</u>
Line 36, "source 1402 is coupled" should read -- source I402 is coupled --.

<u>Column 9,</u>
Line 5, "source 1402." should read -- source I401.".
Line 7, "1402 in response" should read -- I402 in response --.

<u>Column 12,</u>
Line 17, "0602 is coupled" should read -- G602 is coupled --.
Line 18, "0603 is coupled" should read -- G603 is coupled --.

Signed and Sealed this

Eighteenth Day of April, 2006

JON W. DUDAS
*Director of the United States Patent and Trademark Office*